United States Patent
Lin (10) Patent No.: US 9,537,480 B2
(45) Date of Patent: Jan. 3, 2017

(54) ELECTRONIC DEVICE AND STATE SWITCHING METHOD BASED ON ELECTRONIC DEVICE

(71) Applicant: Lenovo (Beijing) Co., Ltd., Beijing (CN)

(72) Inventor: Lvming Lin, Beijing (CN)

(73) Assignee: Lenovo (Beijing) Co., Ltd., Beijing (CN)

( * ) Notice: Subject to any disclaimer, the term of this patent is extended or adjusted under 35 U.S.C. 154(b) by 519 days.

(21) Appl. No.: 14/076,778

(22) Filed: Nov. 11, 2013

(65) Prior Publication Data

US 2014/0132081 A1 May 15, 2014

(30) Foreign Application Priority Data

Nov. 12, 2012 (CN) .......................... 2012 1 0450954

(51) Int. Cl.
*H01H 35/00* (2006.01)
*H03K 17/94* (2006.01)

(52) U.S. Cl.
CPC ............ *H03K 17/94* (2013.01); *Y10T 307/766* (2015.04)

(58) Field of Classification Search
USPC .......................................................... 307/116
See application file for complete search history.

(56) References Cited

U.S. PATENT DOCUMENTS

| 2011/0175894 A1* | 7/2011 | Wakimoto | ........... G09G 3/3648 345/212 |
| 2013/0007473 A1* | 1/2013 | van der Lee | ........... G06F 1/206 713/300 |

FOREIGN PATENT DOCUMENTS

| CN | 101626425 A | 1/2010 |
| CN | 101957653 A | 1/2011 |
| CN | 102300298 A | 12/2011 |

OTHER PUBLICATIONS

First Chinese Office Action regarding Application No. 201210450954.3 dated Nov. 27, 2015. English translation provided by Unitalen Attorneys at Law.

\* cited by examiner

*Primary Examiner* — Rexford Barnie
*Assistant Examiner* — Dru Parries
(74) *Attorney, Agent, or Firm* — Harness, Dickey & Pierce, P.L.C.

(57) ABSTRACT

An electronic device is provided, which includes a fixing unit, a detection unit and a control unit. The fixing unit is adapted to maintain a position of the electronic device relative to a user when the user uses the electronic device. The detection unit is adapted to detect a spatial parameter of the electronic device being moved in a space. The control unit is adapted to obtain the spatial parameter, determine whether the spatial parameter matches a predetermined parameter condition, and control the electronic device to switch from a first operation mode to a second operation mode when the spatial parameter matches the predetermined parameter condition, wherein the first operation mode is different from the second operation mode.

19 Claims, 2 Drawing Sheets

ELECTRONIC DEVICE AND STATE SWITCHING METHOD BASED ON ELECTRONIC DEVICE

This application claims the priority for Chinese Patent Application No. 201210450954.3, entitled "ELECTRONIC DEVICE AND STATE SWITCHING METHOD BASED ON ELECTRONIC DEVICE", filed with the Chinese Patent Office on Nov. 12, 2012, which is incorporated by reference in its entirety herein.

FIELD OF THE DISCLOSURE

The disclosure relates to the field of electronic information technology, and particularly to an electronic device. The disclosure also relates to a state switching method based on the electronic device.

BACKGROUND

With the increasing quality of life, people give more demands to electronic products, especially to the convenience and integration of electronic products. In order to meet requirements of consumers for electronic product integration, an electronic device with peripheral units such as screens is produced.

This electronic device is fixed on the body of a user by a fixing unit. In use, the electronic device may push calls, text messages, weather information and the like to users in real time, bringing great convenience to users. However, with the conventional electronic device, when there is no need to display the real-time information, it requires the user to manually turn off the electronic device, i.e., it is unable to turn off the electronic device based on the usage, which leads to insufficient intelligence of the switching process of the electronic device.

Therefore, how to switch the usage state of the electronic device in a timely manner when the usage requirement changes and to improve the intelligence level of the electronic device has become an urgent problem to be solved by those skilled in the art.

SUMMARY

An object of the disclosure is to provide an electronic device which can switch from a first operation mode to a second operation mode as the change of the usage state, so as to switch the usage state of the electronic device in a timely manner according to usage requirements, thus improving the intelligence level of the electronic device. Another object of the disclosure is to provide a state switching method based on the electronic device.

To achieve the above objects, an electronic device is provided according to the disclosure, which includes:
  a fixing unit adapted to maintain a position of the electronic device relative to a user when the user uses the electronic device;
  a detection unit adapted to detect a spatial parameter of the electronic device being moved in a space; and
  a control unit adapted to obtain the spatial parameter, determine whether the spatial parameter matches a predetermined parameter condition, and control the electronic device to switch from a first operation mode to a second operation mode when the spatial parameter matches the predetermined parameter condition, wherein the first operation mode is different from the second operation mode.

Preferably, in the first operation mode, a power consumption of the electronic device is a first power consumption; in the second operation mode, the power consumption of the electronic device is a second power consumption, where the second power consumption is lower than the first power consumption.

Preferably, the electronic device further includes a first assembly adapted to be turned on when the electronic device is in the first operation mode, and to be turned off when the electronic device is in the second operation mode.

Preferably, in the first operation mode, the electronic device consumes electricity when maintaining a display content, and in the second operation mode, the electronic device does not consume electricity when maintaining the display content.

Preferably, the electronic device further includes a first display unit and a second display unit, wherein the first display unit consumes electricity when maintaining a displaying, and the second display unit does not consume electricity when maintaining the displaying;
  when the electronic device is in the first operation mode, the first display unit is in a maintaining displaying state; and when the electronic device is in the second operation mode, the first display unit is in a non-maintaining displaying state and the second display unit is in a maintaining displaying state.

Preferably, in the first operation mode, a triggering time for switching the electronic device from a first operation state to a second operation state automatically is a first time;
  in the second operation mode, a triggering time for switching the electronic device from the first operation state to the second operation state automatically is a second time; and
  the first power consumption of the electronic device in the first operation state is higher than the second power consumption of the electronic device in the second operation state, and the first time is longer than the second time.

Preferably, the spatial parameter is a final attitude value or a process change value of the electronic device.

Preferably, the detection unit is adapted to detect the spatial parameter of the electronic device when the electronic device is in the first operation mode.

Preferably, the fixing unit is adapted to maintain a position of the electronic device relative to a limb portion of a user when the user uses the electronic device.

Preferably, when the electronic device is in the first operation mode, a first application in the electronic device is in a first running state; and when the electronic device is in the second operation mode, the first application in the electronic device is in a second running state, and the first running state is different from the second running state.

An electronic device is provided according to the disclosure, which includes:
  a fixing unit adapted to maintain a position of the electronic device relative to a user when the user uses the electronic device;
  a detection unit adapted to detect a spatial parameter of the electronic device being moved in a space;
  a transmission unit adapted to transmit the spatial parameter to a control device communicated with the electronic device, and to receive an instruction from the control device, wherein the instruction is generated by the control device according to the spatial parameter; and
  a control unit adapted to control the electronic device to switch from a first operation mode to a second operation mode according to the instruction generated by the control device, wherein the first operation mode is different from the second operation mode.

A state switching method is provided according to the disclosure, which is applied to an electronic device which includes a fixing unit for maintaining a position of the electronic device relative to a user when the user uses the electronic device, and the state switching method includes:

collecting a spatial parameter of the electronic device being moved in a space;

determining whether the spatial parameter satisfies a predetermined condition to obtain a determination result; and when the determination result indicates that the spatial parameter satisfies the predetermined condition, switching the electronic device from a first operation mode to a second operation mode, wherein the first operation mode is different from the second operation mode.

Further, in the first operation mode, a power consumption of the electronic device is a first power consumption; in the second operation mode, the power consumption of the electronic device is a second power consumption, and the second power consumption is lower than the first power consumption.

Further, the electronic device includes a first assembly, and the switching the electronic device from a first operation mode to a second operating mode includes:

switching the first assembly from a turn-on state to a turn-off state.

Further, the switching the electronic device from a first operation mode to a second operation mode includes:

switching the electronic device from a mode that consumes electricity when a display content is maintained to a mode that does not consume electricity when the display content is maintained.

Further, in the first operation mode, a triggering time for switching the electronic device from a first operation state to a second operation state automatically is a first time;

in the second operation mode, the triggering time for switching the electronic device from the first operation state to the second operation state automatically is a second time; and the first power consumption of the electronic device in the first operation state is higher than the second power consumption of the electronic device in the second operation state, and the first time is longer than the second time.

Further, the electronic device includes a detection unit adapted to detect a spatial parameter of the electronic device being moved in a space;

the collecting a spatial parameter of the electronic device being moved in a space includes:

when the electronic device is in the first operation mode, turning on the detection unit and detecting, by the detection unit, the spatial parameter of the electronic device being moved in a space.

Further, when the electronic device is in the first operation mode, a first application in the electronic device is in a first running state, and when the electronic device is in the second operation mode, the first application in the electronic device is in a second running state, and wherein the first running state is different from the second running state.

The electronic device provided by the disclosure includes the fixing unit, the detection unit and the control unit. The fixing unit is adapted to maintain a position of the electronic device relative to a user when the user uses the electronic device. The detection unit is adapted to detect a spatial parameter of the electronic device being moved in a space. The control unit is adapted to obtain the spatial parameter, determine whether the spatial parameter matches a predetermined parameter condition, and control the electronic device to switch from the first operation mode to the second operation mode when the spatial parameter matches the predetermined parameter condition, where the first operation mode is different from the second operation mode. In this way, it is able to control the electronic device to switch from the first operation mode to the second operation mode according to the change of the detected spatial parameter, so as to switch the usage state of the electronic device in a timely manner according to usage requirements, thus improving the intelligence level of the electronic device.

A state switching method based on the electronic device is provided described above according to the disclosure. The state switching method has a same core inventive point and a substantially same beneficial effect with the electronic device described above, which will not be described in detail herein.

DETAILED DESCRIPTION

In order to enable those skilled in the art to better understand the technical solution of the disclosure, the disclosure will be described in more detail hereinafter in conjunction with drawings and specific embodiments.

Figure 1:
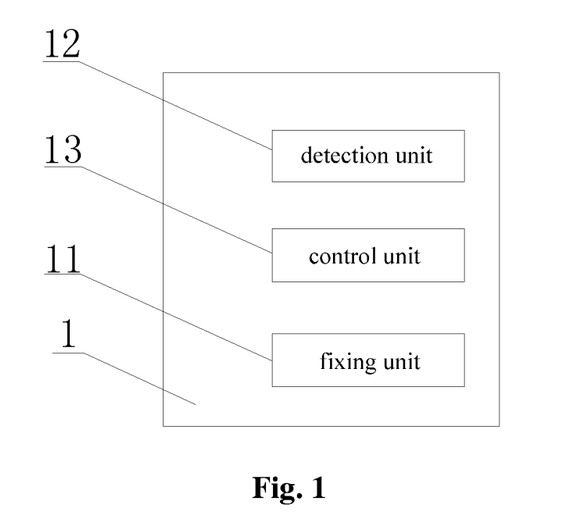
FIG. 1 is a schematic structural diagram of an electronic device according to the disclosure.

Referring to FIG. 1, a schematic structural diagram of an electronic device according to the disclosure is shown.

An electronic device 1 according to the disclosure includes a fixing unit 11, a detection unit 12 and a control unit 13. The electronic device is fixed on the body of the user by the fixing unit 11. The fixing unit 11 is adapted to maintain a position of the electronic device 1 relative to the user when the user uses the electronic device. The spatial position of the fixing unit 11 may be varied as the change of the pose of the user. The detection unit 12 is adapted to detect a spatial parameter of the electronic device 1 being moved in a space, and to transmit the detected spatial parameter to the control unit 13. When the spatial position of the fixing unit 11 is changed, the spatial parameter detected by the detection unit 12 may be changed accordingly. The control unit 13 is adapted to obtain the spatial parameter and determine whether the spatial parameter matches a predetermined parameter condition; and when the spatial parameter matches the predetermined parameter condition, the control unit 13 controls the electronic device 1 to switch from a first operation mode to a second operation mode, where the first operation mode is different from the second operation mode. In this way, the electronic device 1 is controlled to switch from the first operation mode to the second operation mode according to the change of the detected spatial parameter, and switch the usage state of the electronic device in a timely manner according to usage requirements, thus improving the intelligence level of the electronic device.

Specifically, the fixing unit 11 is adapted to maintain a position of the electronic device 1 relative to a limb portion of the user when the user uses the electronic device 1. Since the limb portions of the body are more flexible parts of the body, the fixing unit 11 for maintaining the position of the electronic device 1 relative to the limb portion of the user can improve the convenience of usage and operation of the electronic device 1. The limb portion may be arms, legs, wrists, hands, or feet, etc., and taking into account the ease of use, the limb portion preferably is the wrist.

When the fixing unit 11 is used to maintain the position of the electronic device 1 relative to the wrist of the user, the fixing unit 11 may form an annular receiving space. For example, the fixing unit 11 may be flexible, and in particular is in a wristband shape, which may form an annular receiving space with a non-fixed size, that is, the size of the annular receiving space can be adjusted. The fixing unit 11 may be rigid, and in particular is a bracelet made of rigid material, which may form an annular receiving space with a fixed size, that is, the size of the annular receiving space is not adjustable.

The fixing unit 11 is not limited to the above embodiment. In theory, in addition to maintaining the position of the electronic device 1 relative to the limb portion of the user, the fixing unit 11 can maintain a position relationship of the electronic device 1 relative to the head, trunk (such as waist or back) and the like of the user.

The detection unit 12 may be a gravity sensor. In this case, when the gravity acceleration values detected by the gravity sensor on three coordinate axes are within a predetermined range, the electronic device 1 is switched from a first operation mode to a second operation mode. That is, when an action of the user causes a change in the spatial position state of the electronic device 1, the current attitude of the electronic device 1 can be determined by the three-axis gravity acceleration values of the gravity sensor and a preset correspondence relation. Specifically, the preset correspondence relation is a correspondence relation between the attitude and the acceleration values under the attitude, or a correspondence relation between set acceleration values and a set attitude. The gravity sensor has a simple structure, and is easy to be installed, thus reducing the production cost.

The detection unit 12 is not limited to the gravity sensor, which may be a gyroscope or a combination of the gravity sensor and the gyroscope, and thus the spatial position state or the spatial attitude of the device may be detected more accurately.

Specifically, the spatial parameter may be a final attitude value of the electronic device 1, i.e. the attitude of the electronic device at the final moment when the time after the attitude of the electronic device stops changing reaches a predetermined time. This attitude may reflect the spatial position of the electronic device at the final time of the motion. The control unit 13 may transmit a corresponding control instruction by determining whether the spatial position matches a predetermined position. For example, when the detected final attitude value indicates that the electronic device is in a vertical state, the electronic device is controlled to be turned off. Therefore, the advantage of the solution is that the switching can be triggered by only determining the final state, regardless of how the user makes the device move, thereby reducing the data determination complexity and enhancing the determination efficiency.

In addition, an initial value and a final value of the spatial attitude of the electronic device may also be detected, and a triggering condition may be determined by the combination thereof. Specifically, the initial value (i.e., the spatial parameter when the spatial parameter starts to be changed) of the spatial attitude of the electronic device, which may reflect an initial position of the electronic device, is firstly detected. For example, it is detected that a substantially horizontal position is the initial position of the electronic device. At a certain time after the end of the attitude change process, the final value (i.e., the spatial parameter when the change of the spatial parameter ends) of the spatial attitude of the electronic device, which can reflect the final position of the electronic device, is then detected. For example, it is detected that a vertical position is the final position of the electronic device. The control unit 13 transmits a corresponding control instruction based on the attitude change of the electronic device from the initial position to the final position. For example, when it is detected that the electronic device is changed from the horizontal position to the vertical position, the electronic device is controlled to be turned off. Therefore, the advantage of the solution is that a variety of switching can be provided, i.e. when it is detected that the device firstly is in a substantial vertical state, then moves and finally reaches a substantial horizontal state (i.e. the device rotates), a first switching instruction, such as an instruction which makes the device is switched from a turn-off state to a turn-on state, can be executed. When it is detected that the device firstly is in a substantially horizontal state, then moves and finally still maintains the substantially horizontal state (i.e. the device shakes), a second switching instruction, such as an instruction which makes the device restart/refresh, can be executed. Apparently, although the end state (final value) is consistent in some embodiments, a different instruction can be executed due to the different initial state (initial value), thus enhancing the intelligence of the device.

Specifically, it is possible to detect the spatial attitude of a certain external surface of the electronic device. For example, firstly a sensor which matches an orientation of a first surface of the electronic device is provided in advance. The orientation of the first surface needs to be determined according to the usage condition of the electronic device. For example, the first surface may be a surface on which a display unit is provided or a surface on which a touch display unit is provided, and the sensor may be arranged, so that its positive direction is set upwards with respect to the horizontal direction, or arranged so that its positive direction forms a predetermined angle relative to the horizontal direction. In the measurement process of the spatial parameter, the sensor firstly detects the initial attitude value of the first surface and then detects the final attitude value of the first surface. When the first surface changes from a horizontal position or a position at a predetermined angle (for example, ±30 degree) relative to the horizontal position to a position perpendicular to the horizontal plane or a position at a certain predetermined angle (for example, ±30 degree) relative to the horizontal angle, the control unit 13 controls the electronic device to switch from a first operation mode to a second operation mode, for example, turning off the electronic device.

In addition, the spatial parameter may also be a process change value of the electronic device, i.e., the change of the spatial position of the electronic device is reflected by the change process of the electronic device in the space, thus providing input for the determination of the control unit 13. Specifically, a sensor which may reflect the spatial attitude of a certain external surface is installed on the electronic device, and the sensor may reflect the spatial state of this surface. The sensor detects in real time the spatial parameter for reflecting the spatial attitude of this surface when the spatial position of the electronic device changes. When the spatial parameter indicates that the electronic device rotates by a predetermined angle for example 90 degree, the control unit 13 controls the electronic device to switch from the first operation mode to the second operation mode. Of course, the determination may also be further made in junction with a time parameter, i.e. determining whether the electronic device continuously rotates for 2 seconds, thus providing a diversity of mode switching; or determining whether the electronic device completes a 90-degree rotation within 2 seconds, thus avoiding misoperation and determining whether it is an intended operation from the user. That is, the control unit 13 utilizes the time parameter and the spatial parameter to determine the matching with the predetermined parameter condition. When the spatial parameter detected within the time parameter matches the predetermined parameter condition, the control unit 13 controls the electronic device to switch from the first operation mode to the second operation mode, thereby avoiding the undesired switching of the operation mode due to an accumulation of a large number of slow spatial parameters.

The spatial parameter may also be an initial value and a process value, i.e. the combination of the initial value and the process value is used as the triggering condition of the electronic device. For example, the detected initial value indicates that the state of the electronic device at the initial time is a horizontal state, and the process value detected in the motion process shows that the electronic device rotates by 90 degree. Therefore, the final value obtained according to the initial value for indicating "horizontal state" and the process value for indicating rotation of 90 degree shows that the electronic device is in a vertical state. At this time, the control unit 13 controls the electronic device to switch from the first operation mode to the second operation mode.

The spatial parameter may also be a combination of the final value and the process value, i.e. the combination of the final value and the process value is used as the triggering condition of the electronic device. For example, the detected process value indicates that the electronic device rotates by 90 degree and the detected final value indicates that the electronic device is in a vertical state. In this case, the control unit 13 controls the electronic device to switch from the first operation mode to the second operation mode.

The detection unit 12 may detect the spatial parameter of the electronic device only when the electronic device 1 is in the first operation mode. When the spatial parameter matches the predetermined parameter condition, the control unit 13 controls the electronic device 1 to switch from the first operation mode to the second operation mode, thus avoiding the occurrence of misoperation in the control process. Furthermore, the detection unit 12 may be activated/turned on only in the first operation mode, thus saving power of the portable device.

Apparently, the detection unit is not limited to detect the spatial parameter only in the first operation mode. The detection unit may detect not only corresponding spatial parameters in the first operation mode, but also detect corresponding spatial parameters in the first operation mode and the second operation mode.

In the electronic device provided by the disclosure, a composite power consumption may be decreased or increased by switching the operation mode. Taking the decrease of the composite power consumption as an example, it can be achieved by switching the mode with a higher composite power consumption to the mode with a lower composite power consumption. Specifically, it can be achieved by directly reducing the power consumption of the electronic device; and can also be achieved by reducing the average power consumption of the electronic device within a certain time period. Of course, the rising of the composite power consumption is a reverse process, which will not be described in detail herein.

In a specific embodiment, with the electronic device provided by the disclosure, the composite power consumption is reduced by automatically controlling the electronic device to switch from the first operation mode with a higher composite power consumption to the second operation mode with a lower composite power consumption. Specifically, the composite power consumption may be reduced by switching the first operation mode with a high power consumption to the second operation mode with a low power consumption, i.e. the reduction of power consumption is achieved immediately. Alternatively, the reduction of the composite power consumption can be achieved by reducing the average power consumption in the operation process, i.e. the reduction of power consumption within a certain time period. In this case, a first average power consumption of the first operation mode is higher than an average power consumption of the second operation mode.

In one embodiment, assuming that the power consumption of the electronic device 1 in the first operation mode is a first power consumption and the power consumption of the electronic device 1 in the second operation mode is a second power consumption, where the first power consumption is lower than the first power consumption. In use of the electronic device, when the spatial parameter received by the control unit 13 matches the predetermined spatial parameter, the control unit 13 controls the electronic device to switch from the first operation mode to the second operation mode, i.e. the electronic device is switched from an operation mode with a high power consumption to an operation mode with a low power consumption, thus reducing the composite power consumption of the electronic device 1.

In the above embodiment, the electronic device can achieve the purpose of saving power by turning off the power components in a timely manner. Specifically, the electronic device 1 includes a first assembly, and the first assembly is a high-power component, i.e. an assembly with the maximum power consumption among assemblies composed of the electronic device, or one or more assemblies with the larger power consumption in a power consumption sequence, or one or more assemblies with a power consumption ratio exceeding a threshold. In addition, the first assembly only has two operation states: on and off. The first assembly is for example an LCD display unit, an LED display unit, or a display unit integrated/combined with a proximity sensing unit/touch sensing unit. When the electronic device 1 is in the first operation mode, the first assembly is in a turn-on state. For example, the first assembly is in the turn-on state when the user is to view the output display content. When the electronic device 1 is in the second operation mode, the first assembly is switched to a turn-off state to reduce power consumption. For the purpose of highlighting the magnitude of the reduction of power consumption, the high-power component is taken as an example in the embodiment described above. Actually, the reduction of power consumption can be achieved by turning off any assembly.

If the electronic device directly has a call function, i.e. the electronic device is equivalent to the existing call devices, such as smart phones or function mobile phones. Namely, the electronic device may be a wearable phone, or the electronic device may communicate with a device with a call function and thus indirectly have a call function. Namely, there is a wired or wireless communication between the electronic device and the exiting call device. The electronic device may be a wearable accessory of the call device, such as an only display screen or an additional display screen. The output display content of the first assembly in the turn-on state includes incoming call information or message content, etc.

If the electronic device directly has a network access function, (i.e., the electronic device is equivalent to the existing network access device (such as PDA, tablet), i.e. the electronic device may be a wearable network access device), or indirectly has a network access function by communicating with a device having a network access function (i.e., there is a wired or wireless communication between the electronic device and the existing network access device, i.e., the electronic device may be a wearable accessory of a network access device (e.g. an only display screen, or an additional display screen)). The output display content of the first assembly in the turn-on state includes Web content.

In the above embodiment, the electronic device can also achieve the purpose of reducing composite power consumption by switching the operation mode of the electronic device in a timely manner. The electronic device 1 includes a second assembly which has two or more operation modes, and different operation modes have different power consumption. In this case, the switching of operation mode is the switching of state of the second assembly itself. For example, the second assembly may be a CPU, which has three states: a running state having a high power consumption relative to other states; a standby mode having a medium power consumption relative to other states, and a turn-off state having a low power consumption relative to other states. In use, the CPU can be set to be in the standby state or the turn-off state when the detection unit 12 detects that the spatial position has changed, so as to reduce power consumption. For example, assuming that the spatial attitude of the electronic device at the horizontal position is the initial value, when the process value detected by the detection unit 12 indicates that the electronic device rotates by 45 degree, the control unit 13 controls the CPU to switch from the running state to the standby state. Still assuming that the spatial attitude of the electronic device at the horizontal position is the initial value, when the process value detected by the detection unit indicates that the electronic device rotates by 90 degree, the control unit 13 controls the CPU to switch from the running state to the turn-off state. It is also possible to assume that the spatial attitude having 45 degree relative to the horizontal plane is the initial value, and when the process value detected by the detection unit indicates that the electronic device rotates by 45 degree, the control unit controls the CPU to switch from the standby state to the turn-off state. Of course, it is also possible to assume that the spatial attitude at the horizontal position is the initial value, and when the process value detected by the detection unit indicates that the electronic device rotates 90 degree, the control unit 13 controls the CPU to switch from the running state to the standby state or the turn-off state.

In many displayable electronic devices, the power consumption of the display unit occupies a large percentage of the overall power consumption of the device. Therefore, in this electronic device, the power consumption reduction mainly considers reducing the power consumption of the display unit.

In another embodiment, in the first operation mode, the electronic device 1 consumes electricity when maintaining a display content; while in the second operation mode, the electronic device 1 does not consume electricity when maintaining the display content. In this case, when the electronic device 1 is switched from the first operation mode to the second operation mode, the electronic device 1 is switched from a mode in which the electronic device consumes electricity when maintaining the display content to a mode in which the electronic device does not consume electricity when maintaining the display content, thereby saving power.

For example, the electronic device includes a first display unit which consumes electricity when maintaining the displaying and a second display unit which does not consume electricity when maintaining the displaying. In use, when the user lifts his arm and keeps the arm horizontal, the detection unit 12 detects the initial value of the spatial attitude. At this time, the electronic device is in the first operation mode described above, the first display unit maintains the displaying, and the electronic device consumes electricity. When the user completes the operation and puts his arm down, the detection unit 12 detects the process value of the spatial parameter of the electronic device, and transmits the spatial parameter to the control unit 13. The control unit 13 compares the spatial parameter with a predetermined parameter. When the spatial parameter matches the predetermined parameter, for example, the process value indicates "rotating by 90 degree", i.e. the arm hangs and reaches a vertical state, the control unit 13 controls the electronic device to switch from the first operation mode to the second operation mode, i.e., switch from the state that the first display unit maintains the displaying to the state that the second display unit maintains the displaying. The electronic device is switched to the display state which does not consume electricity, thus reducing power consumption.

In the above embodiment, the first display unit and the second display unit may be overlap-arranged. The overlap-arrangement of two display units can improve the overall utilization of the display area.

The overlap-arrangement of the first display unit and the second display unit may be achieved in the following way: the second display unit is arranged above the first display unit, and when the second display unit displays, the first display unit is in the turn-off state, and when the first display unit displays, the second display unit is switched to a transparent state, i.e. a state that the transmittance satisfies a threshold.

Specifically, the second display unit may be an electronic paper, the first display unit may be an LCD/LED display screen, and the electronic paper is arranged above the LCD/LED display screen. In this case, when the electronic paper displays, the LCD/LED display is turned off; and when the LCD/LED displays, the electronic paper is switched to a transparent mode. A specific process of switching the electronic paper to the transparent mode includes: adding a control unit 13 between the pixels so that by means of positive and negative control, charges in each pixel presents a left-right distribution. In this case, the electronic paper is in a transparent state and the transmittance of light in an up-down direction exceeds a threshold. The threshold is set according to a condition that the user perspective effect may be satisfied, for example any transmittance in the range of 40-100%.

Of course, it is also possible to arrange the first display unit above the second display unit. When the first display unit displays, the second display unit is in a turn-off state or a non-update state, and when the second display unit displays, the first display unit is switched to a transparent state, i.e. a state that the transmittance satisfies a threshold.

Specifically, the second display unit may be an electronic paper, and the first display unit may be a transparent OLED display screen, and the OLED display screen is arranged over the electronic paper. In this case, when the OLED displays, the electronic paper can be turned off or in a non-update state, and when the electronic paper displays, the OLED is turned off and switched to the transparent state, so that the transmittance of light in an up-down direction exceeds a threshold. The threshold is set according to a condition that the user perspective effect can be satisfied.

The first operation mode is a mode which displays local information (e.g. call application, SMS application) or network information. In the first operation mode, the second display unit maintains the displaying, the electronic device consumes electricity. The second operation mode is a mode which displays a fixed pattern or a certain icon (e.g. maker LOGO). In the second operation mode, the display unit maintains the displaying, thus maintaining the displaying in this mode does not consume electricity.

That is, all the display units of the entire device may display the content. When the user views/uses/operates the device, the display content that the user wants to see needs to be displayed in better visual parameters (brightness, contrast, resolution). When the user does not view/use/operate the device, the display content is displayed for the surrounding viewers, therefore the relative fixed contents may be displayed, such as an image matching with clothing of the user may be displayed to enhance the overall aesthetics of the wearable device or a specific vendor ID may be displayed to enhance the visibility of the vendor/device.

Of course, the arrangement relationship between the first display unit and the second display unit is not limited to the overlap arrangement. In the case not considering effective utilization of the display area, the first display unit and the second display unit may be arranged as an upper screen and a lower screen which are separated, or a left screen and a right screen which are separated.

In another embodiment, in the first operation mode, the triggering time for switching the electronic device 1 from the first operation state to the second operation state automatically is the first time; in the second operation mode, the triggering time for switching the electronic device 1 from the first operation state to the second operation state automatically is the second time. The first power consumption of the electronic device 1 in the first operation state is higher than the second power consumption thereof in the second operation state, and the first time is longer than the second time. Namely, in a different operation mode, the triggering time for switching the electronic device from one operation state to another operation state is shortened. When the detection unit 12 detects that the spatial parameter satisfies a predetermined condition, the control unit 13 controls the electronic device to switch from the first operation mode to a second operation mode, such that the time for switching the electronic device from the first operation state to the second operation state is shortened.

The triggering time refers to a time period in which the electronic device is automatically switched from the running mode to a standby mode due to no input for a certain period of time, for example a standby time of the electronic device. For example, in the first operation mode, the standby time of the electronic device is 15 seconds, and in the second operation mode, the standby time of the electronic device is 5 seconds. When the initial value of the spatial parameter detected by the detection unit 12 indicates that the electronic device is in a horizontal state and the final value detected by the detection unit 12 indicates that the electronic device is in a horizontal state, the control unit 13 controls the electronic device to switch from the first operation mode to the second operation mode, thus shortening the standby time of the electronic device and reducing the average power consumption of the electronic device. That is, in the first operation mode, if the electronic device is not operated by the user within 30 seconds, the device will be switched from the running mode to the standby mode after 15 seconds. In this case, the power consumption within 30 seconds is the sum of the power consumption of the running mode in 15 seconds and the power consumption of the standby mode in 15 seconds. In the second operation mode, within 30 seconds, if the electronic device is not operated by the user within 30 seconds, the device will be switched from the running mode to the standby mode after 5 seconds. In this case, the power consumption within 30 seconds is the sum of the power consumption of the running mode in 5 seconds and the power consumption of the standby mode in 25 seconds. Apparently, the power consumption within 30 seconds in the first operation mode is larger than the power consumption within 30 seconds in the second operation mode, i.e. when the electronic device is switched from the first operation mode to the second operation mode, the average power consumption is reduced.

In the above embodiment, the reduction of the power consumption is achieved by switching the electronic device from the first operation mode to the second operation mode. In actual, with the electronic device provided by the disclosure, the rising of the power consumption may also be achieved. That is, the power consumption in the first operation mode is lower than that in the second operation mode, and the power consumption of the electronic device will rise when the electronic device is switched from the first operation mode to the second operation mode.

The electronic device provided by the disclosure is not limited to the electronic device with the judgment function. It may be the electronic device adapted to directly receive instructions from the outside.

Figure 2:
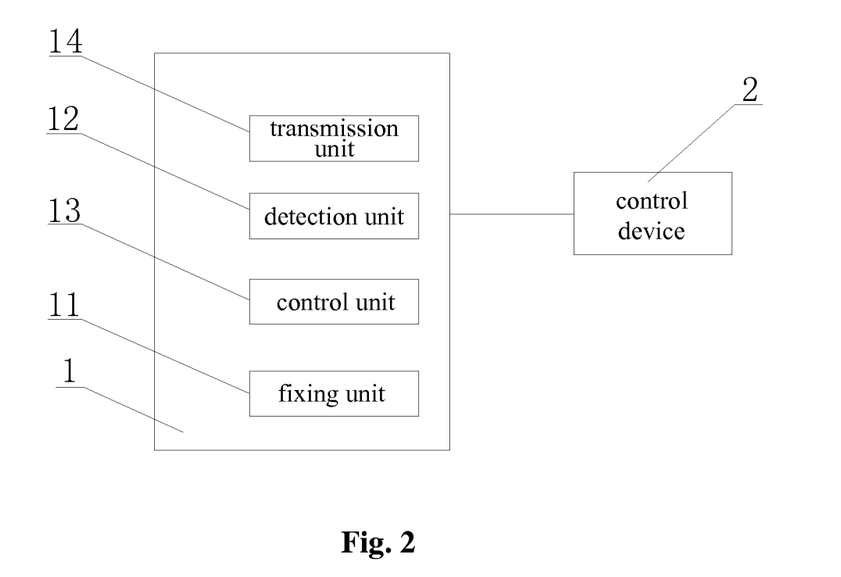
FIG. 2 is a schematic structural diagram of another electronic device according to the disclosure.

Referring to FIG. 2, a schematic structural diagram of another electronic device is shown according to the disclosure.

The electronic device provided by the disclosure includes: a fixing unit 11, a detection unit 12, a transmission unit 14 and a control unit 13. The fixing unit 11 is adapted to maintain a position of a user relative to the electronic device 1 when the user uses the electronic device 1. The detection unit 12 is adapted to detect the spatial parameter of the electronic device 1 being moved in a space. The transmission unit 14 is adapted to transmit the spatial parameter to a control device communicated with the electronic device 1, and to receive an instruction from the control device, in which the instruction is generated by the control device according to the spatial parameter. The control unit 13 is adapted to control the electronic device 1 to switch from the first operation mode to the second operation mode according to the instruction generated by the control device, in which the first operation mode is different from the second operation mode.

The electronic device works with the control device 2 provided at the outside, and forms a signal connection with the control device 2 via a data path. The detection unit 12 transmits the detected spatial parameter signal to the control device 2. The control device 2 compares the detected spatial parameter with a predetermined parameter; determines whether the spatial parameter matches the predetermined parameter; and if the spatial parameter matches the predetermined parameter, the control device 2 transmits an instruction to the control unit 13. The control unit 13 controls the electronic device to switch from the first operation mode to the second operation mode.

The control device 2 may be PC, PAD, PHONE or TV, etc. The data path may be a wired path or a wireless path.

The control unit 13 of the electronic device 1 itself does not have the determination function, the spatial parameter detected by the detection unit 12 is transmitted to the control device 2 at the outside via the transmission unit 14, the control device 2 transmits an instruction to the control unit 13, and the control unit 13 controls the electronic device 1 to switch from the first operation mode to the second operation mode according to the transmitted instruction. In this way, the structure of the electronic device itself is simplified.

The electronic device provided by the disclosure can be not only used to achieve composite power management/control (which is achieved mainly by managing or controlling hardware), but also used to achieve management/control of other functions (which is achieved mainly by managing or controlling OS or applications (process or thread)).

That is, in the first operation mode, a first application (which may be a process of the application or may be a thread) in the electronic device is in a first running state; in the second operation mode, the first application in the electronic device is in the second running state, wherein the first running state is different from the second running state.

Specifically, firstly, the spatial parameter of the electronic device being moved in a space is detected. Then, the control unit 13 obtains a correspondence relation between spatial parameters and application management commands, and determines an application management command corresponding to the detected spatial parameter according to the spatial parameter and the correspondence relation, and executes the corresponding application management command, so that the first application of the electronic device is switched from a first running state to a second running state.

In one embodiment, the first spatial parameter corresponds to a command for switching the application A to a display state, which can be achieved by the following two ways. In a first way, when the application A is not started, it requires to start the application A, and makes the application A displayed on the foreground. In a second way, when the application A has been started but is not displayed in the foreground, the application A is switched to be displayed on the foreground.

Specifically, when the detected first spatial parameter is the preset spatial parameter, it is determined according to the above correspondence relation that the time application (displaying the current time, displaying the countdown time) in the electronic device needs to be switched to a display state, i.e. the time application is started and displayed on the foreground, or the started time application is switched from the background mode to the foreground mode in which the time application may be displayed. Preferably, the time application is associated with the case that the electronic device is switched from a substantial vertical state to a substantial horizontal state (this correspondence relation is stored in a correspondence relation list). When it is detected that the electronic device is switched from the substantial vertical state to the substantial horizontal state, a control command is triggered so that the time application is started and displayed, or the time application is switched from the background to the foreground by a control instruction. At this time, the electronic device displays time.

The advantage of this solution is highlighted specially in the case where the fixing unit 11 is used to fix the position of the electronic device relative to the wrist. This is because the switching from the substantial vertical state to the substantial horizontal state indicates that the user hopes the wristband device to switch from a visual state to a non-visual state, which is the same with the requirements when the user usually uses the wristband watch. Thus, a certain display time application conforms to user habits, thus reducing the difficulty for a user to memory this action and use the correspondence relation.

Of course, the time application is only a distance application, and it may also be a navigation application (such as a compass application or a map application).

In another embodiment, the second space parameter corresponds to a command for switching the application B to a non-display state, which can be achieved by the following two ways. In a first way, when the application B is started, the application B can be closed/exit. In a second way, when the application B is started, the application B can be switched to run on the background.

Specifically, when the detected second spatial parameter is a preset spatial parameter, it is determined according to the correspondence relation described above that the time application in the electronic device needs to be switched to a non-display state, i.e., the time application is closed/exits, or to a background mode in which the time application is not displayed. Preferably, the time application is associated with the case that the electronic device is switched from a substantially horizontal state to a substantial vertical state (this certain correspondence relation is stored in a correspondence relation list). When it is detected that the electronic device is switched from the substantially horizontal state to the substantial vertical state, a control command is triggered so that the time application is closed/exits, or the time application is switched from the foreground to the background in response to a control instruction, for not being displayed.

The advantage of this solution is highlighted especially in the case where the fixing unit 11 is used to fix the position of the electronic device relative to the wrist. Since this requirement is the same as the requirement when a user uses a wristband watch, the difficulty for the user to memory this action and to use the correspondence relation is decreased.

Furthermore, the above two embodiments may also be used in combination. For example, when the second spatial parameter is detected, not only the time application is closed/exits, but also the displaying of a predetermined image (e.g. LOGO) is triggered. That is, in a correspondence relation list, a same spatial parameter may have two different correspondence relations, i.e. a spatial parameter corresponds to an instruction A of an application A and an instruction B of an application B, in which the application A is different from the application B and the instruction A is different from the instruction B.

In another embodiment, in the correspondence relation list, a same spatial parameter may correspond to the instruction A of the application A and the instruction A of the application B, i.e., a same control is performed to the at least two applications. For example, the application A and the application B are started simultaneously or closed simultaneously. That is, the difference between the first running state and the second running state is the running state of the application.

Specifically, when the detected third spatial parameter is a preset spatial parameter, it is determined according to the correspondence relation described above that a first application set in the electronic device needs to be turned off. Specifically, this process includes: determining a first application set and controlling applications in the application set to be closed/exit. There are many methods for determining the first application set. For example, in a first method, the first application set includes all user application (i.e., all applications (process/thread) which are not responsible for maintaining the system operation). In a second method, the first application set includes: idle applications (all or part), i.e., the time application that is not running, the time application that is not switched to the foreground, the application that exceeds the time threshold, or all the idle applications. In a third method, the first application set includes: user applications in a non-processing state, i.e. any one of all applications which are not responsible for maintaining the running of the operation system, the application in the non-processing state (such as downloading applications, compressed applications, anti-virus applications or search applications) is closed.

In another embodiment, the application management may also refer to executing the control command in the application, such as a refresh/update command in the application.

Specifically, when the third spatial parameter is detected, the program in the control application C is controlled to execute a refresh or update command. For example, when the spatial parameter indicates any continuous motion of the electronic device within a predetermined time (e.g. 3 seconds), the recycle application is controlled to execute a cleaning instruction. As another example, when the spatial parameter indicates that the electronic device moves continuously within a predetermined time (e.g. 5 seconds), the initial state is a substantial horizontal state, and the final state is a substantial horizontal state, a SMS/e-mail/SNS (blog, Twitter) application is controlled to refresh in order to check new contents.

When the applications are managed or controlled, the management or control for the application is triggered by a wearable device and is executed by another controlled host.

That is, when the wearable device is in the first operation mode, the wearable device transmits an instruction to the controlled host, the controlled host receives the instruction and instructs a first application (which may be a process of an application program, or may be a thread) in the host to be in a first running state. When the wearable device is in the second operation mode, the wearable device transmits an instruction to the controlled host to instruct the first application in the controlled host to be in a second running state. The first running state is different from the second running state.

Specifically, firstly the spatial parameter of the electronic device being moved in a space is detected, then the controlled host obtains a correspondence relation between the spatial parameter and the application management command, determines an application management command corresponding to the detected spatial parameter, and executes the corresponding application management command. In this way, the first application of the controlled host is switched from a first running state to a second running state.

In addition to the electronic device, a state switching method based on the electronic device is provided according to the disclosure.

Figure 3:
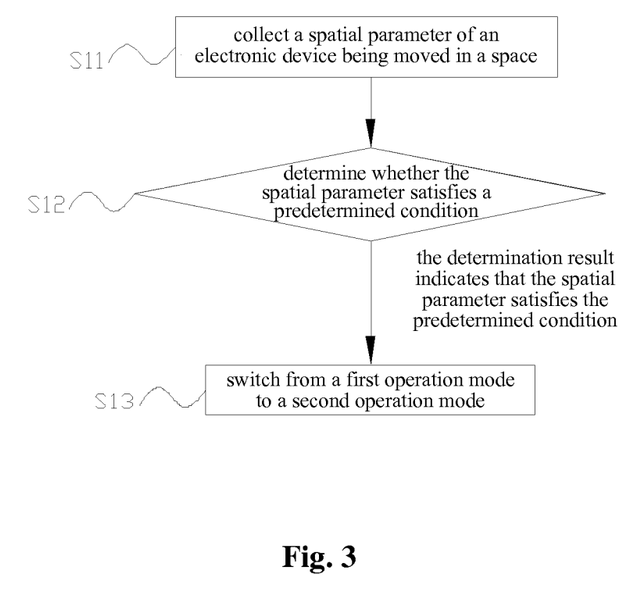
FIG. 3 is a flow chart of an embodiment of a state switching method according to the disclosure.

Referring to FIG. 3, a flow chart of a specific embodiment of a state switching method provided by the disclosure is shown.

In a specific embodiment, the state switching method provided by the disclosure is applied to an electronic device 1, the electronic device 1 includes a fixing unit 11, a detection unit 12 and a control unit 13. The electronic device is fixed to the body of a user by the fixing unit 11. When the user uses the electronic device 1, the fixing unit 11 maintains a relative position relation between the electronic device 1 and the user, and the change of the attitude of the user will cause the change of the spatial position of the fixing unit 11. The state switching method includes the following steps S11-S13.

S11: collecting a spatial parameter of the electronic device 1 being moved in a space.

S12: determining whether the spatial parameter satisfies a predetermined condition to obtain a determination result.

When the determination result indicates that the spatial parameter satisfies the predetermined condition, the process proceeds to step S13.

S13: switching the electronic device 1 from a first operation mode to a second operation mode different from the first operation mode.

Thus, the electronic device 1 can be controlled to switch from the first operation mode to the second operation mode according to the change of the detected spatial parameter. In this way, the usage state of the electronic device may be switched in a timely manner according to usage requirements, thus improving the intelligence level of the electronic device.

Specifically, the fixing unit 11 is adapted to maintain a position of the electronic device 1 relative to a limb portion of the user when the user uses the electronic device 1. Since the limb portions of the body are more flexible parts of the body, the fixing unit 11 for maintaining the position of the electronic device 1 relative to the limb portion of the user can improve the convenience of usage and operation of the electronic device 1. The limb portion may be arms, legs, wrists, hands, or feet, etc., and taking into account the ease of use, the limb portion preferably is the wrist.

When the fixing unit 11 is used to maintain the position of the electronic device 1 relative to the wrist of the user, the fixing unit 11 may form an annular receiving space. For example, the fixing unit 11 may be flexible, and in particular is in a wristband shape, which may form an annular receiving space with a non-fixed size, that is, the size of the annular receiving space can be adjusted. The fixing unit 11 may be rigid, and in particular is a bracelet made of rigid material, which may form an annular receiving space with a fixed size, that is, the size of the annular receiving space is not adjustable.

The fixing unit 11 is not limited to the above embodiment. In theory, in addition to maintaining the position of the electronic device 1 relative to the limb portion of the user, the fixing unit 11 can maintain a position relationship of the electronic device 1 relative to the head, trunk (such as waist or back) and the like of the user.

Specifically, the detection unit 12 for detecting the spatial parameter of the electronic device 1 being moved in a space in the step S11 may be a gravity sensor. In this case, when the gravity acceleration values detected by the gravity sensor on three coordinate axes are within a predetermined range, the electronic device 1 is switched from a first operation mode to a second operation mode. That is, when an action of the user causes a change in the spatial position state of the electronic device 1, the current attitude of the electronic device 1 can be determined by the three-axis gravity acceleration values of the gravity sensor and a preset correspondence relation. Specifically, the preset correspondence relation is a correspondence relation between the attitude and the acceleration values under the attitude, or a correspondence relation between set acceleration values and a set attitude. The gravity sensor has a simple structure, and is easy to be installed, thus reducing the production cost.

The detection unit 12 for detecting the spatial parameter of the electronic device in the step S11 is also not limited to the gravity sensor, which may be a gyroscope or a combination of the gravity sensor and the gyroscope, and thus the spatial position state or the spatial attitude of the device may be detected more accurately.

Specifically, the spatial parameter detected in the step S11 may be a final attitude value of the electronic device 1, i.e. the attitude of the electronic device at the final moment when the time after the attitude of the electronic device stops changing reaches a predetermined time. This attitude may reflect the spatial position of the electronic device at the final time of the motion. The control unit 13 may transmit a corresponding control instruction by determining whether the spatial position matches a predetermined position. For example, when the detected final attitude value indicates that the electronic device is in a vertical state, the electronic device is controlled to be turned off. Therefore, the advantage of the solution is that the switching can be triggered by only determining the final state, regardless of how the user makes the device move, thereby reducing the data determination complexity and enhancing the determination efficiency.

In addition, an initial value and a final value of the spatial attitude of the electronic device may also be detected and a triggering condition may be determined by the combination thereof. Specifically, the initial value (i.e., the spatial parameter when the spatial parameter starts to be changed) of the spatial attitude of the electronic device, which may reflect an initial position of the electronic device, is firstly detected. For example, it is detected that a substantially horizontal position is the initial position of the electronic device. At a certain period of time after the end of the attitude change process, the final value (i.e., the spatial parameter when the change of the spatial parameter ends) of the spatial attitude of the electronic device, which can reflect the final position of the electronic device, is then detected. For example, it is detected that a vertical position is the final position of the electronic device. The control unit 13 transmits a corresponding control instruction based on the attitude change of the electronic device from the initial position to the final position. For example, when it is detected that the electronic device is changed from the horizontal position to the vertical position, the electronic device is controlled to be turned off. Apparently, the advantage of the solution is that a variety of switching can be provided, i.e. when it is detected that the device firstly is in a substantial vertical state, then moves and finally reaches a substantial horizontal state (i.e. the device rotates), a first switching instruction, such as an instruction which makes the device is switched from a turn-off state to a turn-on state, can be executed. When it is detected that the device firstly is in a substantially horizontal state, then moves and finally still maintains the substantially horizontal state (i.e. the device shakes), a second switching instruction, such as an instruction which makes the device restart/refresh, can be executed. Apparently, although the end state (final value) is consistent in some embodiments, a different instruction can be executed due to the different initial state (initial value), thus enhancing the intelligence of the device.

Specifically, it is possible to detect the spatial attitude of a certain external surface of the electronic device. For example, firstly a sensor which matches an orientation of a first surface of the electronic device is provided in advance. The orientation of the first surface needs to be determined according to the usage condition of the electronic device. For example, the first surface may be a surface on which a display unit is provided or a surface on which a touch display unit is provided, and the sensor may be arranged so that its positive direction is set upwards with respect to corresponds to the horizontal direction, or arranged so that its positive direction forms a predetermined angle relative to the horizontal direction. In the measurement process of the spatial parameter, the sensor firstly detects the initial attitude value of the first surface and then detects the final attitude value of the first surface. When the first surface changes from a horizontal position or a position at a predetermined angle (for example, ±30 degree) relative to the horizontal position to a position perpendicular to the horizontal plane or a position at a certain predetermined angle (for example, ±30 degree) relative to the horizontal angle, the control unit 13 controls the electronic device to switch from a first operation mode to a second operation mode, for example, turning off the electronic device.

In addition, the spatial parameter detected in the step S11 may also be a process change value of the electronic device, i.e., the change of the spatial position of the electronic device is reflected by the change process of the electronic device in the space, thus providing input for the determination of the control unit 13. Specifically, a sensor which may reflect the spatial attitude of a certain external surface is installed on the electronic device, and the sensor may reflect the spatial state of this surface. The sensor detects in real time the spatial parameter for reflecting the spatial attitude of this surface when the spatial position of the electronic device changes. When the spatial parameter indicates that the electronic device rotates by a predetermined angle for example 90 degree, the control unit 13 controls the electronic device to switch from the first operation mode to the second operation mode. Of course, the determinate may also be further made in junction with a time parameter, i.e. determining whether the electronic device continuously rotates for 2 seconds, thus providing a diversity of mode switching; or determining whether the electronic device completes a 90-degree rotation within 2 seconds, thus avoiding misoperation and determining whether it is an intended operation from the user. That is, the control unit 13 utilizes the time parameter and the spatial parameter to determine the matching with the predetermined parameter condition. When the spatial parameter detected within the time parameter matches the predetermined parameter condition, the control unit 13 controls the electronic device to switch from the first operation mode to the second operation mode, thereby avoiding the undesired switching of the operation mode due to an accumulation of a large number of slow spatial parameters.

The spatial parameter may also be an initial value and a process value, i.e. the combination of the initial value and the process value is used as the triggering condition of the electronic device. For example, the detected initial value indicates that the state of the electronic device at the initial time is a horizontal state, and the process value detected in the motion process shows that the electronic device rotates by 90 degree. Therefore, the final value obtained according to the initial value for indicating "horizontal state" and the process value for indicating rotation of 90 degree shows that the electronic device is in a vertical state. At this time, the control unit 13 controls the electronic device to switch from the first operation mode to the second operation mode.

The spatial parameter may also be a combination of the final value and the process value, i.e. the combination of the final value and the process value is used as the triggering condition of the electronic device. For example, the detected process value indicates that the electronic device rotates by 90 degree and the detected final value indicates that the electronic device is in a vertical state. In this case, the control unit 13 controls the electronic device to switch from the first operation mode to the second operation mode.

In the step S11, the detection unit 12 may detect the spatial parameter of the electronic device only when the electronic device 1 is in the first operation mode. When the spatial parameter matches the predetermined parameter condition, the control unit 13 controls the electronic device 1 to switch from the first operation mode to the second operation mode, thus avoiding the occurrence of misoperation in the control process. Furthermore, the detection unit 12 may be activated/turned on only in the first operation mode, thus saving power of the portable device.

Apparently, the detection unit is not limited to detect the spatial parameter only in the first operation mode. The detection unit may detect not only corresponding spatial parameters in the first operation mode, but also detect corresponding spatial parameters in the first operation mode and the second operation mode.

In the state switching method provided by the disclosure, the composite power consumption may be decreased or increased by switching the operation mode. Taking the decrease of the composite power consumption as an example, it can be achieved by switching the mode with a higher composite power consumption to the mode with a lower composite power consumption. Specifically, it can be achieved by directly reducing the power consumption of the electronic device and can also be achieved by reducing the average power consumption of the electronic device within a certain time period. Of course, the rising of the composite power consumption is a reverse process, which will not be described in detail herein.

In a specific embodiment, with the state switching method provided by the disclosure, the composite power consumption is reduced by automatically controlling the electronic device to switch from the first operation mode with a higher composite power consumption to the second operation mode with a lower composite power consumption. Specifically, the composite power consumption may be reduced by switching the first operation mode with a high power consumption to the second operation mode with a low power consumption, i.e. the reduction of power consumption is achieved immediately. Alternatively, the reduction of the composite power consumption can be achieved by reducing the average power consumption in the operation process, i.e. the reduction of power consumption within a certain time period. In this case, a first average power consumption of the first operation mode is higher than an average power consumption of the second operation mode.

In one embodiment, assuming that the power consumption of the electronic device 1 in the first operation mode is a first power consumption and the power consumption of the electronic device 1 in the second operation mode is a second power consumption, where the first power consumption is lower than the first power consumption. In use of the electronic device, when the spatial parameter received by the control unit 13 matches the predetermined spatial parameter, the control unit 13 controls the electronic device to switch from the first operation mode to the second operation mode, i.e. the electronic device is switched from an operation mode with a high power consumption to an operation mode with a low power consumption, thus reducing the composite power consumption of the electronic device 1.

In the above embodiment, the state switching method can achieve the purpose of saving power by turning off the power components in a timely manner. Specifically, the electronic device 1 includes a first assembly, and the first assembly is a high-power component, i.e. an assembly with the maximum power consumption among assemblies composed of the electronic device, or one or more assemblies with the larger power consumption in a power consumption sequence, or one or more assemblies with a power consumption ratio exceeding a threshold. In addition, the first assembly only has two operation states: on and off. The first assembly is for example an LCD display unit, an LED display unit, or a display unit integrated/combined with a proximity sensing unit/touch sensing unit. When the electronic device 1 is in the first operation mode, the first assembly is in a turn-on state. For example, the first assembly is in the turn-on state when the user is to view the output display content. When the electronic device 1 is in the second operation mode, the first assembly is switched to a turn-off state to reduce power consumption. For the purpose of highlighting the magnitude of reduction of power consumption, the high-power component is taken as an example in the embodiment described above. Actually, the reduction of power consumption can be achieved by turning off any assembly.

If the electronic device directly has a call function, i.e. the electronic device is equivalent to the existing call devices, such as smart phones or function mobile phones. Namely, the electronic device may be a wearable phone, or the electronic device may communicate with a device with a call function and thus indirectly have a call function. Namely, there is a wired or wireless communication between the electronic device and the exiting call device. The electronic device may be a wearable accessory of the call device, such as an only display screen or an additional display screen. The output display content of the first assembly in the turn-on state includes incoming call information or message content, etc.

If the electronic device directly has a network access function, (i.e., the electronic device is equivalent to the existing network access device (such as PDA, tablet), i.e. the electronic device may be a wearable network access device), or indirectly has a network access function by communicating with a device having a network access function (i.e., there is a wired or wireless communication between the electronic device and the existing network access device, i.e., the electronic device may be a wearable accessory of a network access device (e.g. an only display screen, or an additional display screen)). The output display content of the first assembly in the turn-on state includes Web content.

In the above embodiment, the state switching method can also achieve the purpose of reducing composite power consumption by switching the operation mode of the electronic device in a timely manner. Specifically, the step of switching the electronic device 1 from the first operation mode to the second operation mode includes switching the electronic device 1 from a mode that consumes electricity when maintaining the display content to a mode that does not consume electricity when maintaining the display content. The electronic device 1 includes a second assembly which has two or more operation modes, and different operation modes have different power consumption for different operation modes. In this case, the switching of operation mode is the switching of state of the second assembly itself. For example, the second assembly may be a CPU, which has three states: a running state having a high power consumption relative to other states; a standby mode having a medium power consumption relative to other states, and a turn-off state having a low power consumption relative to other states. In use, the CPU can be set to be in the standby state or the turn-off state when it is detected by the detection unit 12 that the spatial position has changed, so as to reduce power consumption. For example, assuming that the spatial attitude of the electronic device at the horizontal position is the initial value, when the process value detected by the detection unit 12 indicates that the electronic device rotates by 45 degree, the control unit 13 controls the CPU to switch from the running state to the standby state. Still assuming that the spatial attitude of the electronic device at the horizontal position is the initial value, when the process value detected by the detection unit indicates that the electronic device rotates by 90 degree, the control unit 13 controls the CPU to switch from the running state to the turn-off state. It is also possible to assume that the spatial attitude having 45 degree relative to the horizontal plane is the initial value, and when the process value detected by the detection unit indicates that the electronic device rotates by 45 degree, the control unit controls the CPU to switch from the standby state to the turn-off state. Of course, it is also possible to assume that the spatial attitude at the horizontal position is the initial value, and when the process value detected by the detection unit indicates that the electronic device rotates 90 degree, the control unit 13 controls the CPU to switch from the running state to the standby state or the turn-off state.

In many displayable electronic devices, the power consumption of the display unit occupies a large percentage of the overall power consumption of the device. Therefore, in this electronic device, the power consumption reduction mainly considers reducing the power consumption of the display unit.

In another embodiment, in the first operation mode, the electronic device 1 consumes electricity when maintaining a display content; while in the second operation mode, the electronic device 1 does not consume electricity when maintaining the display content. In this case, when the electronic device 1 is switched from the first operation mode to the second operation mode, the electronic device 1 is switched from a mode in which the electronic device consumes electricity when maintaining the display content to a mode which the electronic device does not consume electricity when maintaining the display content, thereby saving power.

For example, the electronic device includes a first display unit which consumes electricity when maintaining the displaying and a second display unit which does not consume electricity when maintaining the displaying. In use, when the user lifts his arm and keeps the arm horizontal, the detection unit 12 detects the initial value of the spatial attitude. At this time, the electronic device is in the first operation mode described above, the first display unit maintains the displaying, and the electronic device consumes electricity. When the user completes the operation and puts his arm down, the detection unit 12 detects the process value of the spatial parameter of the electronic device, and transmits the spatial parameter to the control unit 13. The control unit 13 compares the spatial parameter with a predetermined parameter. When the spatial parameter matches the predetermined parameter, for example, the process value indicates "rotating by 90 degree", i.e. the arm hangs and reaches a vertical state, the control unit 13 controls the electronic device to switch from the first operation mode to the second operation mode, i.e., switch from the state that the first display unit maintains the displaying to the state that the second display unit maintains the displaying. The electronic device is switched to the display state which does not consume electricity, thus reducing power consumption.

In the above embodiment, the first display unit and the second display unit may be overlap-arranged. The overlap-arrangement of two display units can improve the overall utilization of the display area.

The overlap-arrangement of the first display unit and the second display unit may be achieved in the following way: the second display unit is arranged above the first display unit, and when the second display unit displays, the first display unit is in the turn-off state, and when the first display unit displays, the second display unit is switched to a transparent state, i.e. a state that the transmittance satisfies a threshold.

Specifically, the second display unit may be an electronic paper, the first display unit may be an LCD/LED display screen, and the electronic paper is arranged above the LCD/LED display screen. In this case, when the electronic paper displays, the LCD/LED display is turned off; and when the LCD/LED displays, the electronic paper is switched to a transparent mode. A specific process of switching the electronic paper to a transparent mode includes: adding a control unit 13 between the pixels so that by means of positive and negative control, charges in each pixel presents a left-right distribution. In this case, the electronic paper is in a transparent state and the transmittance of light in an up-down direction exceeds a threshold. The threshold is set according to a condition that the user perspective effect may be satisfied, for example any transmittance in the range of 40-100%.

Of course, it is also possible to arrange the first display unit above the second display unit. When the first display unit displays, the second display unit is in a turn-off state or a non-update state, and when the second display unit displays, the first display unit is switched to a transparent state, i.e. a state that the transmittance satisfies a threshold.

Specifically, the second display unit may be an electronic paper, and the first display unit may be a transparent OLED display screen, and the OLED display screen is arranged over the electronic paper. In this case, when the OLED displays, the electronic paper can be turned off or in a non-update state, and when the electronic paper displays, the OLED is turned off and switched to the transparent state, so that the transmittance of light in an up-down direction exceeds a threshold. The threshold is set according to a condition that the user perspective effect can be satisfied.

The first operation mode is a mode which displays local information (e.g. call application, SMS application) or network information. In the first operation mode, the second display unit maintains the displaying, the electronic device consumes electricity. The second operation mode is a mode which displays a fixed pattern or a certain icon (e.g. maker LOGO). In the second operation mode, the display unit maintains the displaying, thus maintaining the displaying in this mode does not consume electricity.

That is, all the display units of the entire device may display the content. When the user views/uses/operates the device, the display content that the user wants to see needs to be displayed in better visual parameters (brightness, contrast, resolution). When the user does not view/use/operate the device, the display content is displayed for the surrounding viewers, therefore the relative fixed contents may be displayed, such as an image matching with clothing of the user may be displayed to enhance the overall aesthetics of the wearable device or a specific vendor ID may be displayed to enhance the visibility of the vendor/device.

Of course, the arrangement relationship between the first display unit and the second display unit is not limited to the overlap arrangement. In the case not considering effective utilization of the display area, the first display unit and the second display unit may be arranged as an upper screen and a lower screen which are separated, or a left screen and a right screen which are separated.

In another embodiment, in the first operation mode, the triggering time for switching the electronic device 1 from the first operation state to the second operation state automatically is the first time; in the second operation mode, the triggering time for switching the electronic device 1 from the first operation state to the second operation state automatically is the second time. The first power consumption of the electronic device 1 in the first operation state is higher than the second power consumption thereof in the second operation state, and the first time is longer than the second time. Namely, in a different operation mode, the triggering time for switching the electronic device from one operation state to another operation state is shortened. When the detection unit 12 detects that the spatial parameter satisfies a predetermined condition, the control unit 13 controls the electronic device to switch from the first operation mode to a second operation mode, such that the time for switching the electronic device from the first operation state to the second operation state is shortened.

The triggering time refers to a time period in which the electronic device is automatically switched from the running mode to a standby mode due to no input for a certain period of time, for example a standby time of the electronic device. For example, in the first operation mode, the standby time of the electronic device is 15 seconds, and in the second operation mode, the standby time of the electronic device is 5 seconds, when the initial value of the spatial parameter detected by the detection unit 12 indicates that the electronic device is in a horizontal state and the final value detected by the detection unit 12 indicates that the electronic device is in a horizontal state, the control unit 13 controls the electronic device to switch from the first operation mode to the second operation mode, thus shortening the standby time of the electronic device and reducing the average power consumption of the electronic device. That is, in the first operation mode, if the electronic device is not operated by the user within 30 seconds, the device will be switched from the running mode to the standby mode after 15 seconds. In this case, the power consumption within 30 seconds is the sum of the power consumption of the running mode in 15 seconds and the power consumption of the standby mode in 15 seconds. In the second operation mode, if the electronic device is not operated by the user within 30 seconds, the device will be switched from the running mode to the standby mode after 5 seconds. In this case, the power consumption within 30 seconds is the sum of the power consumption of the running mode in 5 seconds and the power consumption of the standby mode in 25 seconds. Apparently, the power consumption within 30 seconds in the first operation mode is larger than the power consumption within 30 seconds in the second operation mode, i.e. when the electronic device is switched from the first operation mode to the second operation mode, the average power consumption is reduced.

In the above embodiment, the reduction of the power consumption is achieved by switching the electronic device from the first operation mode to the second operation mode. In actual, with the electronic device provided by the disclosure, the rising of the power consumption may also be achieved. That is, the power consumption in the first operation mode is lower that that in the second operation mode, and the power consumption of the electronic device will rise when the electronic device is switched from the first operation mode to the second operation mode.

The electronic device provided by the disclosure is not limited to the electronic device with the determination function. It may be the electronic device adapted to directly receive instructions from the outside.

Referring to FIG. 2, a schematic structural diagram of another electronic device provided by the disclosure is shown.

The electronic device provided by the disclosure includes: a fixing unit 11, a detection unit 12, a transmission unit 14 and a control unit 13. The fixing unit 11 is adapted to maintain a position of a user relative to the electronic device 1 when the user uses the electronic device 1. The detection unit 12 is adapted to detect the spatial parameter of the electronic device 1 being moved in a space. The transmission unit 14 is adapted to transmit the spatial parameter to a control device communicated with the electronic device 1, and to receive an instruction from the control device, in which the instruction is generated by the control device according to the spatial parameter. The control unit 13 is adapted to control the electronic device 1 to switch from the first operation mode to the second operation mode according to the instruction generated by the control device, in which the first operation mode is different from the second operation mode.

The electronic device works with the control device 2 provided at the outside, and forms a signal connection with the control device 2 via a data path. The detection unit 12 transmits the detected spatial parameter signal to the control device 2. The control device 2 compares the detected spatial parameter with a predetermined parameter; determines whether the spatial parameter matches the predetermined parameter; and if the spatial parameter matches the predetermined parameter, the control device 2 transmits an instruction to the control unit 13. The control unit 13 controls the electronic device to switch from the first operation mode to the second operation mode.

The control device 2 may be PC, PAD, PHONE or TV, etc. The data path may be a wired path or a wireless path.

The control unit 13 of the electronic device 1 itself does not have the determination function, the spatial parameter detected by the detection unit 12 is transmitted to the control device 2 at the outside via the transmission unit 14, the control device 2 transmits an instruction to the control unit 13, and the control unit 13 controls the electronic device 1 to switch from the first operation mode to the second operation mode according to the transmitted instruction. In this way, the structure of the electronic device itself is simplified.

The state switching method provided by the disclosure can be not only used to achieve composite power management/control (which is achieved mainly by managing or controlling hardware), but also used to achieve management/control of other functions (which is achieved mainly by managing or controlling OS or applications (process or thread)).

That is, in the first operation mode, a first application (which may be a process of the application or may be a thread) in the electronic device is in a first running state; in the second operation mode, the first application in the electronic device is in the second running state, wherein the first running state is different from the second running state.

Specifically, firstly, the spatial parameter of the electronic device being moved in a space is detected. Then the control unit 13 obtains a correspondence relation between spatial parameters and application management commands, and determines an application management command corresponding to the detected spatial parameter according to the spatial parameter and the correspondence relation, and executes the corresponding application management command, so that the first application of the electronic device is switched from a first running state to a second running state.

In one embodiment, the first spatial parameter corresponds to a command for switching the application A to a display state, which can be achieved by the following two ways. In a first way, when the application A is not started, it requires to start the application A, and makes the application A displayed on the foreground. In a second way, when the application A has been started but is not displayed in the foreground, the application A is switched to be displayed on the foreground.

Specifically, when the detected first spatial parameter is the preset spatial parameter, it is determined according to the above correspondence relation that the time application (displaying the current time, displaying the countdown time) in the electronic device needs to be switched to a display state, i.e. the time application is started and displayed on the foreground, or the started time application is switched from the background mode to the foreground mode in which the time application may be displayed. Preferably, the time application is associated with the case that the electronic device is switched from a substantial vertical state to a substantial horizontal state (this correspondence relation is stored in a correspondence relation list). When it is detected that the electronic device is switched from the substantial vertical state to the substantial horizontal state, a control command is triggered so that the time application is started and displayed, or the time application is switched from the background to the foreground by a control instruction. At this time, the electronic device displays time.

The advantage of this solution is highlighted specially in the case where the fixing unit 11 is used to fix the position of the electronic device relative to the wrist. This is because the switching from the substantial vertical state to the substantially horizontal state indicates that the user hopes the wristband device to switch from a visual state to a non-visual state, which is the same with the requirements when the user usually uses the wristband watch. Thus, a certain display time application conforms to user habits, thus reducing the difficulty for a user to memory this action and use the correspondence relation.

Of course, the time application is only a distance application, and it may also be a navigation application (such as a compass application or a map application).

In another embodiment, the second space parameter corresponds to a command for switching the application B to a non-display state, which can be achieved by the following two ways. In a first way, when the application B is started, the application B can be closed/exit. In a second way, when the application B is started, the application B can be switched to run on the background.

Specifically, when the detected second spatial parameter is a preset spatial parameter, it is determined according to the correspondence relation described above that the time application in the electronic device needs to be switched to a non-display state, i.e., the time application is closed/exits, or to a background mode in which the time application is not displayed. Preferably, the time application is associated with the case that the electronic device is switched from a substantially horizontal state to a substantial vertical state (this certain correspondence relation is stored in a correspondence relation list). When it is detected that the electronic device is switched from the substantially horizontal state to the substantial vertical state, a control command is triggered so that the time application is closed/exits, or the time application is switched from the foreground to the background in response to a control instruction, for not being displayed.

The advantage of this solution is highlighted especially in the case where the fixing unit 11 is used to fix the position of the electronic device relative to the wrist. Since this requirement is the same as the requirement when a user uses a wristband watch, the difficulty for the user to memory this action and to use the correspondence relation is decreased.

Furthermore, the above two embodiments may also be used in combination. For example, when the second spatial parameter is detected, not only the time application is closed/exits, but also the displaying of a predetermined image (e.g. LOGO) is triggered. That is, in a correspondence relation list, a same spatial parameter may have two different correspondence relations, i.e. a spatial parameter corresponds to an instruction A of an application A and an instruction B of an application B, in which the application A is different from the application B and the instruction A is different from the instruction B.

In another embodiment, in the correspondence relation list, a same spatial parameter may correspond to the instruction A of the application A and the instruction A of the application B, i.e., a same control is performed to the at least two applications. For example, the application A and the application B are started simultaneously or closed simultaneously. That is, the difference between the first running state and the second running state is the running state of the application.

Specifically, when the detected third spatial parameter is a preset spatial parameter, it is determined according to the correspondence relation described above that a first application set in the electronic device needs to be turned off. Specifically, this process includes: determining a first application set and controlling applications in the application set to be closed/exit. There are many methods for determining the first application set. For example, in a first method, the first application set includes all user application (i.e., all applications (process/thread) which are not responsible for maintaining the system operation). In a second method, the first application set includes: idle applications (all or part), i.e., the time application that is not running, the time application that is not switched to the foreground, the application that exceeds the time threshold, or all the idle applications. In a third method, the first application set includes: user applications in a non-processing state, i.e. any one of all applications which are not responsible for maintaining the running of the operation system, application in the non-processing state (such as downloading applications, compressed applications, anti-virus applications or search applications) is closed.

In another embodiment, the application management may also refer to executing the control command in the application, such as a refresh/update command in the application.

Specifically, when the third spatial parameter is detected, the program in the control application C is controlled to execute a refresh or update command. For example, when the spatial parameter indicates any continuous motion of the electronic device within a predetermined time (e.g. 3 seconds), the recycle application is controlled to execute a cleaning instruction. As another example, when the spatial parameter indicates that the electronic device moves continuously within a predetermined time (e.g. 5 seconds), the initial state is a substantial horizontal state, and the final state is a substantial horizontal state, a SMS/e-mail/SNS (blog, Twitter) application is controlled to refresh in order to check new contents.

When the applications are managed or controlled, the management or control for the application is triggered by a wearable device and is executed by another controlled host.

That is, when the wearable device is in the first operation mode, the wearable device transmits an instruction to the controlled host, the controlled host receives the instruction and instructs a first application (which may be a process of an application program, or may be a thread) in the host to be in a first running state. When the wearable device is in the second operation mode, the wearable device transmits an instruction to the controlled host to instruct the first application in the controlled host to be in a second running state. The first running state is different from the second running state.

Specifically, firstly the spatial parameter of the electronic device being moved in a space is detected, then the controlled host obtains a correspondence relation between the spatial parameter and the application management command, determines an application management command corresponding to the detected spatial parameter, and executes the corresponding application management command. In this way, the first application of the controlled host is switched from a first running state to a second running state.

In the above, the electronic device and the state switching method based on the electronic device provided by the disclosure are introduced in detail. The principle and implementations of the disclosure are illustrated herein by means of only some specific embodiments, and the illustration to the specific embodiments is only for helping understand the method and core ideas of the disclosure. It should be noted that, number of improvements and modifications can be made to the disclosure by those skilled in the art without departing from the principle of the disclosure, and these improvements and modifications also fall within the scope of protection of the claims of the disclosure.

The invention claimed is:

1. An electronic device, comprising:
   a fixing unit adapted to maintain a position of the electronic device relative to a user in the case that the user uses the electronic device;
   a detection unit adapted to detect a spatial parameter of the electronic device being moved in a space;
   a control unit adapted to obtain the spatial parameter, determine whether the spatial parameter matches a predetermined parameter condition, and control the electronic device to switch from a first operation mode to a second operation mode in the case that the spatial parameter matches the predetermined parameter condition, wherein the first operation mode is different from the second operation mode;
   a first display unit adapted to consume electricity when maintaining a displaying; and
   a second display unit adapted to do not consume electricity when maintaining the displaying;
   in the case that the electronic device is in the first operation mode, the first display unit is in a maintaining displaying state; and in the case that the electronic device is in the second operation mode, the first display unit is in a non-maintaining displaying state and the second display unit is in a maintaining displaying state.

2. The electronic device according to claim 1, wherein in the first operation mode, a power consumption of the electronic device is a first power consumption; and in the second operation mode, the power consumption of the electronic device is a second power consumption, wherein the second power consumption is lower than the first power consumption.

3. The electronic device according to claim 2, further comprising a first assembly adapted to be turned on in the case that the electronic device is in the first operation mode, and to be turned off in the case that the electronic device is in the second operation mode.

4. The electronic device according to claim 2, wherein in the first operation mode, the electronic device consumes electricity when maintaining a display content; and in the second operation mode, the electronic device does not consume electricity when maintaining the display content.

5. The electronic device according to claim 1, wherein
   in the first operation mode, a triggering time for switching the electronic device from a first operation state to a second operation state automatically is a first time;
   in the second operation mode, the triggering time for switching the electronic device from the first operation state to the second operation state automatically is a second time; and
   the first power consumption of the electronic device in the first operation state is higher than the second power consumption of the electronic device in the second operation state, and the first time is longer than the second time.

6. The electronic device according to claim 1, wherein the spatial parameter is a final attitude value or a process change value of the electronic device.

7. The electronic device according to claim 1, wherein the detection unit is adapted to detect the spatial parameter of the electronic device in the case that the electronic device is in the first operation mode.

8. The electronic device according to claim 1, wherein the fixing unit is adapted to maintain a position of the electronic device relative to a limb portion of a user in the case that the user uses the electronic device.

9. The electronic device according to claim 1, wherein in the case that the electronic device is in the first operation mode, a first application in the electronic device is in a first running state; and when the electronic device is in the second operation mode, the first application in the electronic device is in a second running state, and wherein the first running state is different from the second running state.

10. An electronic device, comprising:
    a fixing unit adapted to maintain a position of the electronic device relative to a user in the case that the user uses the electronic device;
    a detection unit adapted to detect a spatial parameter of the electronic device being moved in a space;
    a transmission unit adapted to transmit the spatial parameter to a control device communicated with the electronic device, and to receive an instruction from the control device, wherein the instruction is generated by the control device according to the spatial parameter;
    a control unit adapted to control the electronic device to switch from a first operation mode to a second operation mode according to the instruction generated by the control device, wherein the first operation mode is different from the second operation mode;
    a first display unit adapted to consume electricity when maintaining a displaying; and
    a second display unit adapted to do not consume electricity when maintaining the displaying;
    in the case that the electronic device is in the first operation mode, the first display unit is in a maintaining displaying state; and in the case that the electronic device is in the second operation mode, the first display unit is in a non-maintaining displaying state and the second display unit is in a maintaining displaying state.

11. A state switching method applied to an electronic device, wherein the electronic device comprises a fixing unit, a first display unit and a second display unit; the fixing unit maintains a position of the electronic device relative to a user in the case that the user uses the electronic device, the first display consumes electricity when maintaining a displaying, and the second display unit does not consume electricity when maintaining the displaying; the state switching method comprises:
   collecting a spatial parameter of the electronic device being moved in a space;
   determining whether the spatial parameter satisfies a predetermined condition to obtain a determination result; and
   in the case that the determination result indicates that the spatial parameter satisfies the predetermined condition, switching the electronic device from a first operation mode to a second operation mode, wherein the first operation mode is different from the second operation mode;
   wherein in the case that the electronic device is in the first operation mode, the first display unit is in a maintaining displaying state; and in the case that the electronic device is in the second operation mode, the first display unit is in a non-maintaining displaying state and the second display unit is in a maintaining displaying state.

12. The state switching method according to claim 11, wherein in the first operation mode, a power consumption of the electronic device is a first power consumption; in the second operation mode, the power consumption of the electronic device is a second power consumption, wherein the second power consumption is lower than the first power consumption.

13. The state switching method according to claim 12, wherein the electronic device comprises a first assembly, and the switching the electronic device from a first operation mode to a second operation mode comprises:
   switching the first assembly from a turn-on state to a turn-off state.

14. The state switching method according to claim 12, wherein the switching the electronic device from a first operation mode to a second operation mode comprises: switching the electronic device from a mode that consumes electricity when a display content is maintained to a mode that does not consume electricity when the display content is maintained.

15. The state switching method according to claim 11, wherein
   in the first operation mode, a triggering time for switching the electronic device from a first operation state to a second operation state automatically is a first time;
   in the second operation mode, the triggering time for switching the electronic device from the first operation state to the second operation state automatically is a second time; and
   the first power consumption of the electronic device in the first operation state is higher than the second power consumption of the electronic device in the second operation state, and the first time is longer than the second time.

16. The state switching method according to claim 11, wherein the electronic device comprises a detection unit adapted to detect a spatial parameter of the electronic device being moved in a space;
   the collecting a spatial parameter of the electronic device being moved in a space comprises:
   in the case that the electronic device is in the first operation mode, turning on the detection unit and detecting, by the detection unit, the spatial parameter of the electronic device being moved in a space.

17. The state switching method according to claim 11, wherein in the case that the electronic device is in the first operation mode, a first application in the electronic device is in a first running state, and in the case that the electronic device is in the second operation mode, the first application in the electronic device is in a second running state, and wherein the first running state is different from the second running state.

18. The electronic device according to claim 1, wherein the first display unit and the second display unit are overlap-arranged, or arranged as an upper screen and a lower screen which are separated or a left screen and a right screen which are separated.

19. The state switching method according to claim 11, wherein the first display unit and the second display unit are overlap-arranged, or arranged as an upper screen and a lower screen which are separated or a left screen and a right screen which are separated.

* * * * *